United States Patent
Hwang et al.

(10) Patent No.: US 11,869,878 B2
(45) Date of Patent: Jan. 9, 2024

(54) SEMICONDUCTOR MODULE INCLUDING A SEMICONDUCTOR PACKAGE CONNECTED TO A MODULE SUBSTRATE AND A BONDING WIRE

(71) Applicant: SAMSUNG ELECTRONICS CO., LTD., Suwon-si (KR)

(72) Inventors: Kyungseon Hwang, Suwon-si (KR); Wonyoung Kim, Suwon-si (KR); Jinchan Ahn, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/453,725

(22) Filed: Nov. 5, 2021

(65) Prior Publication Data

US 2022/0059506 A1    Feb. 24, 2022

Related U.S. Application Data

(63) Continuation of application No. 16/695,971, filed on Nov. 26, 2019, now Pat. No. 11,171,119.

(30) Foreign Application Priority Data

May 17, 2019    (KR) .................. 10-2019-0058312

(51) Int. Cl.
*H01L 25/065* (2023.01)
*H01L 23/00* (2006.01)
(Continued)

(52) U.S. Cl.
CPC ...... *H01L 25/0657* (2013.01); *H01L 23/3142* (2013.01); *H01L 23/49816* (2013.01);
(Continued)

(58) Field of Classification Search
CPC ........................... H01L 25/0657; H01L 23/31
See application file for complete search history.

(56) References Cited

U.S. PATENT DOCUMENTS

| 4,446,477 A | 5/1984 | Currie et al. |
| 4,698,662 A | 10/1987 | Young et al. |

(Continued)

FOREIGN PATENT DOCUMENTS

| KR | 10-2006-0039614 | 5/2006 |
| KR | 10-2015-0054551 | 5/2015 |

OTHER PUBLICATIONS

Office Action dated Mar. 13, 2023, in corresponding Korean Patent Application 10-2019-0058312, (44 pages).

*Primary Examiner* — Yu-Hsi D Sun
(74) *Attorney, Agent, or Firm* — F. CHAU & ASSOCIATES, LLC

(57) ABSTRACT

A semiconductor module includes a module substrate, a semiconductor package mounted on the module substrate, a first bonding wire connecting the module substrate to the semiconductor package, and a first molding member covering the first bonding wire. The semiconductor package includes a package substrate, a semiconductor chip mounted on the package substrate, a second bonding wire connecting the package substrate to the semiconductor chip, and a second molding member covering the semiconductor chip and the second bonding wire. The first and second bonding wires are each connected to one connection pad of the package substrate.

14 Claims, 15 Drawing Sheets

(51) Int. Cl.
*H01L 23/498* (2006.01)
*H01L 23/31* (2006.01)

(52) U.S. Cl.
CPC .............. *H01L 24/29* (2013.01); *H01L 24/45* (2013.01); *H01L 24/73* (2013.01)

(56) References Cited

U.S. PATENT DOCUMENTS

| | | |
|---|---|---|
| 6,683,373 B1 | 1/2004 | Vendier et al. |
| 6,838,761 B2 | 1/2005 | Karnezos |
| 7,170,158 B2 | 1/2007 | Choi et al. |
| 7,468,893 B2 | 12/2008 | Goodwin |
| 7,989,269 B2 | 8/2011 | Do et al. |
| 2011/0298129 A1* | 12/2011 | Hong ...................... H01L 25/03 257/738 |
| 2013/0015570 A1 | 1/2013 | Sato |
| 2015/0130078 A1 | 5/2015 | Hong et al. |
| 2018/0211943 A1 | 7/2018 | Song et al. |
| 2019/0161339 A1* | 5/2019 | Ishikawa ............. H01L 23/3157 |
| 2020/0365559 A1 | 11/2020 | Hwang et al. |

* cited by examiner

SEMICONDUCTOR MODULE INCLUDING A SEMICONDUCTOR PACKAGE CONNECTED TO A MODULE SUBSTRATE AND A BONDING WIRE

CROSS-REFERENCE TO RELATED APPLICATIONS

This application is a continuation application of U.S. application Ser. No. 16/695,971, filed on Nov. 26, 2019, which claims priority under 35 U.S.C. § 119 to Korean Patent Application No. 10-2019-0058312, filed on May 17, 2019 in the Korean Intellectual Property Office, and the disclosures of the above referenced applications are incorporated by reference herein in their entirety.

TECHNICAL FIELD

Exemplary embodiments of the inventive concept relate to a semiconductor module, and more particularly, to a semiconductor module including a semiconductor package connected to a module substrate and a bonding wire.

DISCUSSION OF RELATED ART

Recently, there has been a constant demand for miniaturized, lighter, and thinner electronic components included in electronic products. For the miniaturized, lighter, thinner electronic components, semiconductor modules mounted thereon are required to process a large amount of data while a volume thereof is decreased. Accordingly, studies are being conducted to efficiently mount semiconductor packages on semiconductor modules having a limited structure.

SUMMARY

According to an exemplary embodiment of the inventive concept, a semiconductor module includes a module substrate, a semiconductor package mounted on the module substrate, a first bonding wire connecting the module substrate to the semiconductor package, and a first molding member covering the first bonding wire. The semiconductor package includes a package substrate, a semiconductor chip mounted on the package substrate, a second bonding wire connecting the package substrate to the semiconductor chip, and a second molding member covering the semiconductor chip and the second bonding wire. The first and second bonding wires are each connected to one connection pad of the package substrate.

According to an exemplary embodiment of the inventive concept, a semiconductor module includes a module substrate including top and bottom surfaces, where the top and bottom surfaces of the module substrate oppose each other, a plurality of semiconductor packages mounted on the top and bottom surfaces of the module substrate, a first bonding wire connecting the module substrate to each of the plurality of semiconductor packages, and a first molding member covering the first bonding wire. Each of the plurality of semiconductor packages includes a package substrate including a top surface on which a connection pad is arranged and a bottom surface on which a test pad is arranged, a semiconductor chip mounted on the top surface of the package substrate, a second bonding wire connecting the package substrate to the semiconductor chip, and a second molding member covering the semiconductor chip and the second bonding wire. A portion of a top surface of one connection pad is covered by the first molding member, and a remaining portion of the top surface of the one connection pad is covered by the second molding member.

According to an exemplary embodiment of the inventive concept, a semiconductor module includes a module substrate, a semiconductor package mounted on the module substrate, a first connection member connecting the module substrate to the semiconductor package, and a first molding member covering the first connection member. The semiconductor package includes a package substrate, a semiconductor chip mounted on the package substrate in a flip chip manner, a second connection member connecting the package substrate to the semiconductor chip, and a second molding member covering the semiconductor chip. A portion of a top surface of one connection pad of the package substrate is covered by the first molding member, and a remaining portion of the top surface of the one connection pad is covered by the second molding member.

BRIEF DESCRIPTION OF THE DRAWINGS

The above and other features of the inventive concept will be more clearly understood by describing in detail exemplary embodiments thereof with reference to the accompanying drawings.

DETAILED DESCRIPTION OF THE EMBODIMENTS

Figure 1:
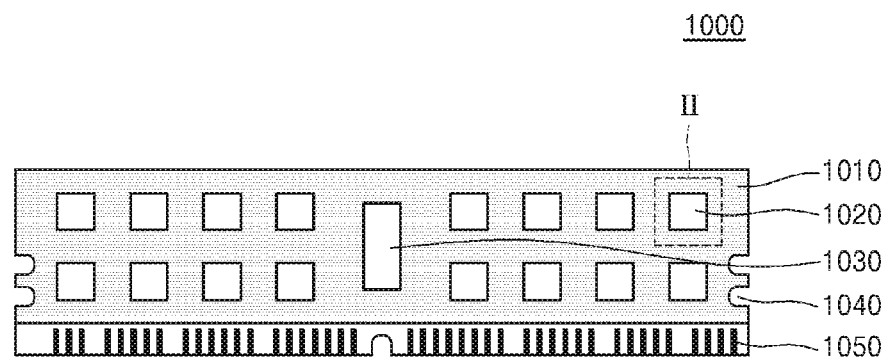
FIG. 1 is a schematic plan view of a semiconductor module, according to an exemplary embodiment of the inventive concept.

Exemplary embodiments of the inventive concept provide a semiconductor module in which a test on a semiconductor package may be easily performed while the semiconductor package may be efficiently mounted in a limited structure of the semiconductor module.

Hereinafter, exemplary embodiments of the inventive concept will be described in detail with reference to the accompanying drawings. Like reference numerals may refer to like elements throughout this application.

FIG. 1 is a schematic plan view of a semiconductor module, according to an exemplary embodiment of the inventive concept.

Referring to FIG. 1, a semiconductor module 1000 may include a module substrate 1010, a plurality of semiconductor packages 1020 and a controller chip 1030 mounted on the module substrate 1010, and an indented structure 1040 and a port 1050 at edges of the module substrate 1010.

The module substrate 1010 may include a supporting substrate on which the plurality of semiconductor packages 1020 and the controller chip 1030 are mounted and may be a printed circuit board (PCB) having a certain form factor. The form factor may define a thickness and a lateral width of the module substrate 1010.

The plurality of semiconductor packages 1020 may include volatile memory semiconductors and/or non-volatile memory semiconductors. A volatile memory semiconductor may be variously implemented as, for example, dynamic random access memory (RAM) (DRAM), static RAM (SRAM), double data DRAM (DDRAM), etc. A non-volatile memory semiconductor may be variously implemented as, for example, a flash memory, phase-change RAM (PRAM), resistive RAM (RRAM), ferroelectric RAM (FRAM), magnetic RAM (MRAM), etc. The plurality of semiconductor packages 1020 may be electrically connected to the port 1050 via wires included in the module substrate 1010.

The controller chip 1030 may control the plurality of semiconductor packages 1020. For example, the controller chip 1030 may, according to a command from an external host, read data stored in the plurality of semiconductor packages 1020 or program new data in the plurality of semiconductor packages 1020.

At least one indented structure 1040 may be included in the semiconductor module 1000 for mounting and fixing the module substrate 1010 to a main board or a system board.

The port 1050 may include a plurality of pins, and the number, a size, and an arrangement of the pins may be determined based on an interface protocol for communication with the external host. The plurality of pins may be connected to a socket included in a main board or a system board.

Exemplary embodiments of the inventive concept provide the semiconductor module 1000 on which a test of each of the plurality of semiconductor packages 1020 may be easily performed within the limited structure of the semiconductor module 1000 having the certain form factor, and the semiconductor module 1000 may be efficiently mounted. Hereinafter, exemplary embodiments of the inventive concept are described in detail.

Figure 2A:
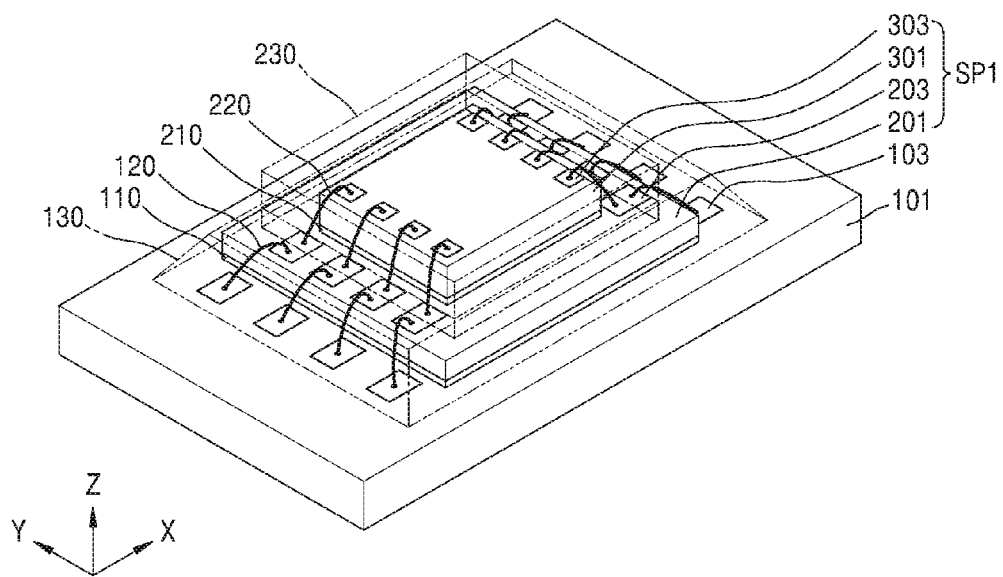
FIGS. 2A through 2C are drawings of a semiconductor module, according to an exemplary embodiment of the inventive concept.
Figure 2B:
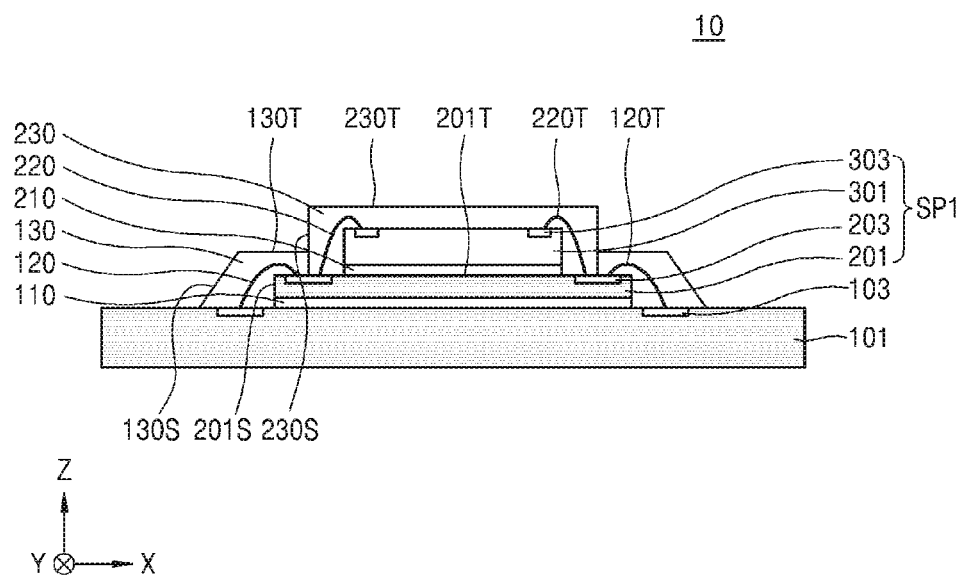
Figure 2C:
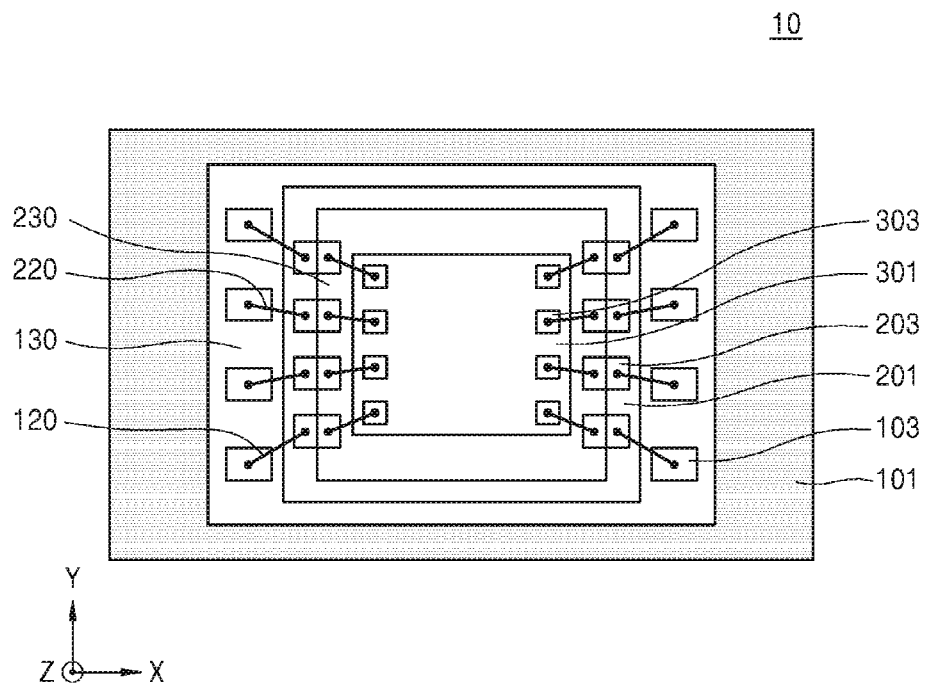

FIGS. 2A through 2C are drawings of a semiconductor module, according to an exemplary embodiment of the inventive concept.

FIGS. 2A through 2C are enlarged drawings of a region II in FIG. 1. FIG. 2A is a perspective view of the semiconductor module 10, FIG. 2B is a cross-sectional view of the semiconductor module 10, and FIG. 2C is a plan view of the semiconductor module 10. For convenience of explanation, a first molding member 130 and a second molding member 230 are illustrated in a transparent manner in FIG. 2A.

Referring to FIGS. 2A through 2C together, the semiconductor module 10 may include a module substrate 101, a semiconductor package SP1 mounted on the module substrate 101, a first bonding wire 120 connecting the module substrate 101 to the semiconductor package SP1, and the first molding member 130 covering the first bonding wire 120.

The module substrate 101 may include a supporting substrate on which the semiconductor package SP1 is mounted and may include a PCB. Wirings may be formed on the module substrate 101, and the wirings may be connected to top electrode pads 103 on a top surface of the module substrate 101. Accordingly, the wirings may be electrically connected to the semiconductor package SP1 via the first bonding wire 120 connected to the top electrode pads 103. In addition, the wirings may be connected to a port (e.g., 1050 in FIG. 1), and thus, the module substrate 101 may be electrically connected to a main board or a system board of an electronic product.

The module substrate 101 (e.g., the PCB) may be generally implemented by pressing to a certain thickness a high polymer material such as thermosetting resin, epoxy resin such as flame retardant 4 (FR-4), bismaleimide triazine (BT), or Ajinomoto build-up film (ABF), or phenolic resin, forming the pressed result into a thin layer, and forming the wirings which are transmission paths of electrical signals.

The module substrate 101 (e.g., the PCB) may be generally divided into a single layer PCB including the wirings on one side thereof, or a double layer PCB including the wirings on both sides thereof. In addition, the number of copper foil layers may be 3 or more by using an insulating material such as a prepreg, and a PCB having a multiple-layer structure may be implemented by forming 3 or more wirings according to the number of formed copper foil layers. Of course, the module substrate 101 is not limited to the structure and material of the above-described PCB.

The semiconductor package SP1 may include a package substrate 201, a semiconductor chip 301 mounted on the package substrate 201, a second bonding wire 220 connecting the package substrate 201 to the semiconductor chip 301, and the second molding member 230 covering the semiconductor chip 301 and the second bonding wire 220. According to a type of the semiconductor chip 301 mounted on the semiconductor package SP1, the semiconductor package SP1 may include a logic package or a memory package. A detailed description of each component included in the semiconductor package SP1 is provided below.

A first adhesive member 110 may be adhered to the top surface of the module substrate 101 and a bottom surface of the semiconductor package SP1. The first adhesive member 110 may include a die attach film. The die attach film may be distinguished as an inorganic adhesive and a polymer adhesive.

The first bonding wire 120 may electrically connect the module substrate 101 to the semiconductor package SP1. The first bonding wire 120 may include a metal such as gold (Au), silver (Ag), copper (Cu), or aluminum (Al). In exemplary embodiments of the inventive concept, the first bonding wire 120 may be connected to the module substrate 101 and the semiconductor package SP1 by a method such as a thermo-compression connection, an ultra-sonic connection, or a thermo-sonic connection.

The first molding member 130 may protect the first bonding wire 120 from external influences. To perform the protection operation, a thickness of the first molding member 130 may be formed large enough to cover at least the entire portion of the first bonding wire 120. In exemplary embodiments of the inventive concept, the first molding member 130 may be formed to cover the entire portion of the first bonding wire 120 and contact a portion of a side surface 230S of the second molding member 230. In other words, a level of a top surface 130T of the first molding member 130 may be formed to be lower than a level of a top surface 230T of the second molding member 230. In addition, at least one of side surfaces 130S of the first molding member 130 may be an inclined surface.

The first molding member 130 may include an epoxy molding compound. The first molding member 130 may not be limited to the epoxy molding compound, but may include, for example, an epoxy-based material, a thermosetting material, a thermoplastic material, an ultra-violet (UV) treatment material, etc.

A contour of the first molding member 130 may be formed by injecting an appropriate amount of molding material onto the module substrate 101 and performing a curing process. In this case, process conditions such as a delay time between injection and curing of the molding material, the amount of the molding material to be injected, and a curing temperature may be set, in consideration of physical properties of the molding material.

Again, each component constituting the semiconductor package SP1 is described in detail.

The package substrate 201 may include a support substrate on which the semiconductor chip 301 is mounted and may include a body portion, a bottom protection layer, and a top protection layer. The package substrate 201 may include a PCB, a wafer substrate, a ceramic substrate, a glass substrate, etc. In the semiconductor module 10 according to exemplary embodiments of the inventive concept, the package substrate 201 may include a PCB. A structure, physical properties, and a type of the PCB may be substantially the same as those described above with reference to the module substrate 101.

A connection pad 203 may be formed on a top surface of the package substrate 201, and the second bonding wire 220 connected to the connection pad 203 may be electrically connected to a chip pad 303 of the semiconductor chip 301. In addition, the connection pad 203 may be connected to the first bonding wire 120, and thus, the module substrate 101 may be electrically connected to the semiconductor chip 301.

In other words, both the first bonding wire 120 and the second bonding wire 220 may be connected to one connection pad 203 of the package substrate 201. In addition, a portion of the one connection pad 203 to which the first bonding wire 120 is connected may be covered by the first molding member 130, and the other portion of the one connection pad 203 to which the second bonding wire 220 is connected may be covered by the second molding member 230.

The semiconductor chip 301 may include a volatile memory semiconductor and/or a non-volatile memory semiconductor. In addition, the semiconductor chip 301 may include a high-bandwidth memory semiconductor. Types of the volatile memory semiconductors and the non-volatile memory semiconductors may be the same as those described above.

The semiconductor chip 301 may include a semiconductor substrate. The semiconductor substrate may include a silicon wafer. The semiconductor substrate may include semiconductor elements such as germanium (Ge), or semiconductor compounds such as silicon carbide (SiC), gallium arsenide (GaAs), indium arsenide (InAs), or indium phosphide (InP). Alternatively, the semiconductor substrate may have a silicon on insulator (SOI) structure. For example, the semiconductor substrate may include a buried oxide (BOX) layer. The semiconductor substrate may include a conductive region, for example, a well doped with an impurity, or a structure doped with an impurity. In addition, the semiconductor substrate may have various element isolation structures such as a shallow trench isolation (STI) structure.

In exemplary embodiments of the inventive concept, the semiconductor chip 301 may include a plurality of memory chip slices capable of mutually merging data with one another. In this case, each of the memory chip slices constituting the semiconductor chip 301 may include a semiconductor substrate including an active surface and an inactive surface opposite to each other, a memory element formed on the active surface, and through silicon vias TSV. In a system in package in which the plurality of memory chip slices are integrated into one package, the number of memory chip slices constituting the semiconductor chip 301 may vary according to an application of the semiconductor module 10.

A second adhesive member 210 may be adhered to the top surface of the package substrate 201 and a bottom surface of the semiconductor chip 301. The second adhesive member 210 may include a die attach film. In other words, the second adhesive member 210 may be adhered to an inactive surface of the semiconductor substrate.

The second bonding wire 220 may electrically connect the package substrate 201 to the semiconductor chip 301. As described above, the first bonding wire 120 may electrically connect the module substrate 101 to the connection pad 203, and the second bonding wire 220 may electrically connect the semiconductor chip 301 to the connection pad 203. As a result, the module substrate 101 may be electrically connected to the semiconductor chip 301. In addition, a level of an uppermost top end 120T of the first bonding wire 120 may be formed to be lower than a level of an uppermost top end 220T of the second bonding wire 220.

The second molding member 230 may protect the second bonding wire 220 from external influences. To perform the protection operation, a thickness of the second molding member 230 may be formed large enough to cover at least both the semiconductor chip 301 and the second bonding wire 220.

A contour of the second molding member 230 may be formed by injecting an appropriate amount of molding material onto the package substrate 201 and performing a curing process. As needed, pressure may be applied to the molding material in a pressing process such as an operation using a press, and the contour of the semiconductor package SP1 may be formed. In this process, a side surface 201S of the package substrate 201 may be formed to protrude outwardly from the side surface 230S of the second molding member 230. In other words, a portion of a top surface 201T of the package substrate 201 may be covered by the second molding member 230, and the remaining portion of the top surface 201T of the package substrate 201 may be covered by the first molding member 130.

As discussed above, recently, there has been a constant demand for miniaturized, lighter, and thinner electronic components included in electronic products. For the miniaturized, lighter, and thinner electronic components, semiconductor modules mounted thereon may be required to process a large amount of data while the volume of the semiconductor modules is decreased. Accordingly, studies are being conducted to efficiently mount semiconductor packages in the limited structure of the semiconductor modules.

According to exemplary embodiments of the inventive concept, by using the first bonding wire 120 instead of a ball grid array (BGA) method, the semiconductor module 10 may be provided in which a test on the semiconductor package SP1 is possible, while the semiconductor package SP1 is efficiently mounted in the limited structure of the semiconductor module 10.

First, efficient mounting of the semiconductor package SP1 on the semiconductor module 10 according to exemplary embodiments of the inventive concept is described below.

In a general semiconductor module, a BGA method may be used in which a semiconductor package is mounted by using a solder ball on a module substrate. In this case, due to a volume occupied by the solder ball itself, an overall thickness of the semiconductor module may be increased. To solve this issue, a land grid array (LGA) method or a method of directly mounting a semiconductor chip on a module substrate may be used. However, the LGA method may result in a low reliability level for the semiconductor module, and the direct mounting method may not secure a sufficient yield for the semiconductor module. Thus, in the semiconductor module 10 according to exemplary embodiments of the inventive concept, the total thickness of the semiconductor module 10 may be relatively reduced by using the first bonding wire 120 instead of a solder ball.

Second, ease of testing of the semiconductor package SP1 on the semiconductor module 10 according to exemplary embodiments of the inventive concept is described below.

In a general semiconductor module, a test may be performed to verify whether the semiconductor package is defective, before mounting the semiconductor package on the module substrate. To perform the test, the general semiconductor package may need to separately prepare a test pad. In this case, the overall area of the semiconductor module may be increased due to an area occupied by the test pad.

In contrast, in the semiconductor module 10 according to exemplary embodiments of the inventive concept, the overall area of the semiconductor module 10 may be relatively reduced by using the connection pad 203 instead of a test pad for performing the test. The test using the connection pad 203 is described below.

As a result, according to exemplary embodiments of the inventive concept, the semiconductor module 10 may be provided which is lighter, thinner, and highly reliable, because the test on the semiconductor package SP1 may be easily performed, and the semiconductor package SP1 may be efficiently mounted in the limited structure of the module substrate 101.

FIGS. 3 through 6 are cross-sectional views of semiconductor modules, according to exemplary embodiments of the inventive concept.

Components constituting each of the semiconductor modules (20, 30, 40, and 50) and materials constituting the components to be described below are substantially the same as or similar to those described with reference to FIGS. 2A through 2C. Thus, for convenience of explanation, differences from the semiconductor module 10 described above are mainly described.

Figure 3:
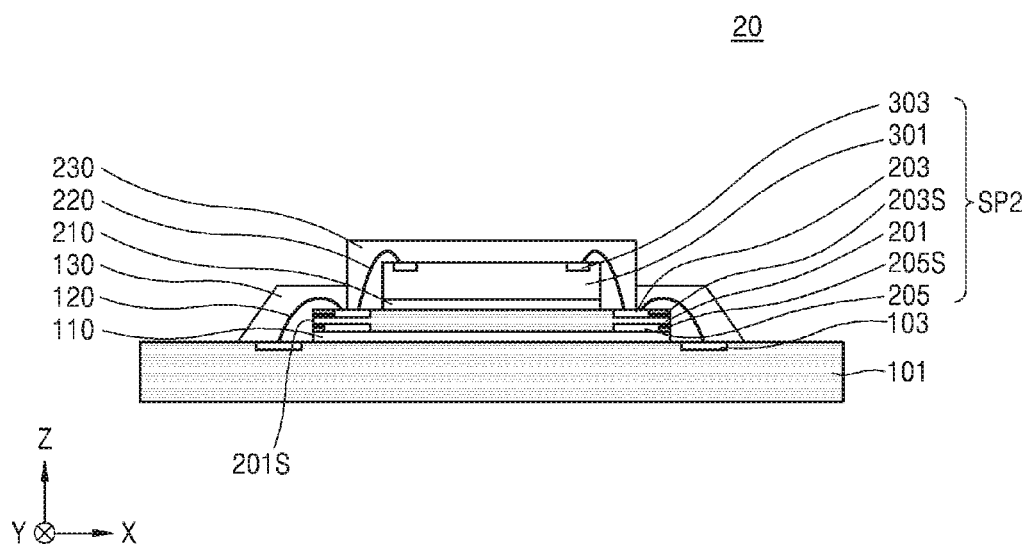
FIGS. 3 through 6 are cross-sectional views of semiconductor modules, according to exemplary embodiments of the inventive concept.

Referring to FIG. 3, a semiconductor module 20 may include the module substrate 101, a semiconductor package SP2 mounted on the module substrate 101, the first bonding wire 120 connecting the module substrate 101 to the semiconductor package SP2, and the first molding member 130 covering the first bonding wire 120.

The connection pad 203 may be formed on the top surface of the package substrate 201, and a test pad 205 may be formed on a bottom surface of the package substrate 201. The package substrate 201 may be electrically connected to the semiconductor chip 301 via the second bonding wire 220 connected to the connection pad 203. In addition, the first bonding wire 120 may connect the connection pad 203 to the module substrate 101, and thus, the module substrate 101 may be electrically connected to the semiconductor chip 301.

A portion of an internal wiring 203S extending from the connection pad 203 and a portion of an internal wiring 205S extending from the test pad 205 may be formed to be exposed on the side surface 201S of the package substrate 201.

The first adhesive member 110 may be adhered to the top surface of the module substrate 101 and a bottom surface of the semiconductor package SP2. In addition, the second adhesive member 210 may be adhered to the top surface of the package substrate 201 and the bottom surface of the semiconductor chip 301. In this case, the connection pad 203 may not be covered by the second adhesive member 210, but the test pad 205 may be covered by the first adhesive member 110. In other words, the test pad 205 may not be electrically connected to the semiconductor chip 301 and the module substrate 101.

In this manner, in the semiconductor module 20 according to exemplary embodiments of the inventive concept, since the test pad 205 is formed on the bottom surface of the package substrate 201 and does not occupy any additional area, an increase in the overall area of the semiconductor module 20 may be prevented.

In addition, as described below, even in the semiconductor package SP2 in which a portion of the connection pad 203 exposed by the second molding member 230 is designed to be small, a test may be easily performed by using the test pad 205.

Figure 4:
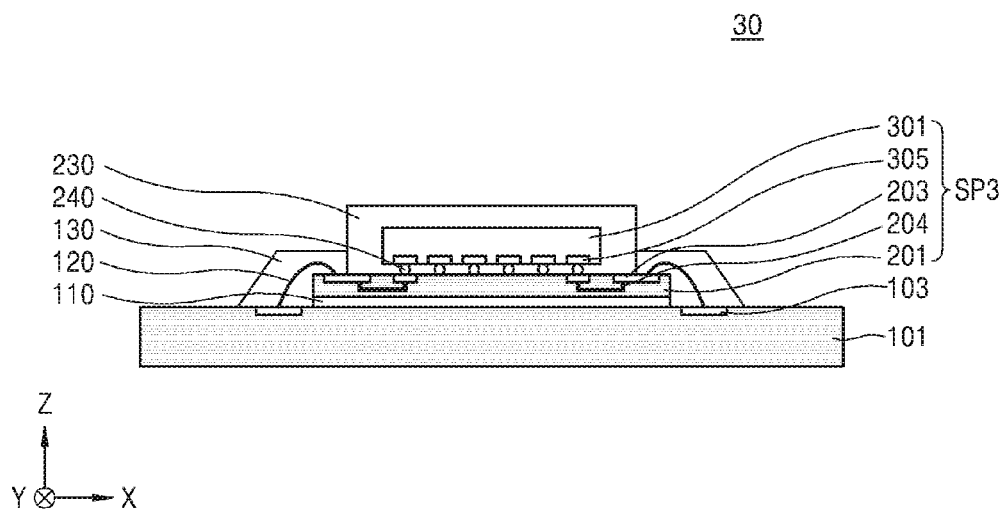

Referring to FIG. 4, a semiconductor module 30 may include the module substrate 101, a semiconductor package SP3 mounted on the module substrate 101, the first bonding wire 120 connecting the module substrate 101 to the semiconductor package SP3, and the first molding member 130 covering the first bonding wire 120.

The package substrate 201 may be electrically connected to the semiconductor chip 301 via a second connection member 240 connected to the connection pad 203. The second connection member 240 may include a solder ball or a solder bump. In other words, in the semiconductor module 30, the semiconductor chip 301 may be mounted on the package substrate 201 in a flip chip manner.

In addition, the first bonding wire 120 may be connected to one connection pad 203 of the package substrate 201, and the second connection member 240 may be connected to another connection pad 203, and thus the connection pads 203 may be connected to one another via an internal wiring 204 of the package substrate 201. In other words, the second bonding wire 220 may be omitted from the semiconductor module 30.

A portion of the one connection pad 203 to which the first bonding wire 120 is connected may be covered by the first molding member 130, and the other portion of the one connection pad 203 to which the first bonding wire 120 is not connected may be covered by the second molding member 230.

Figure 5:
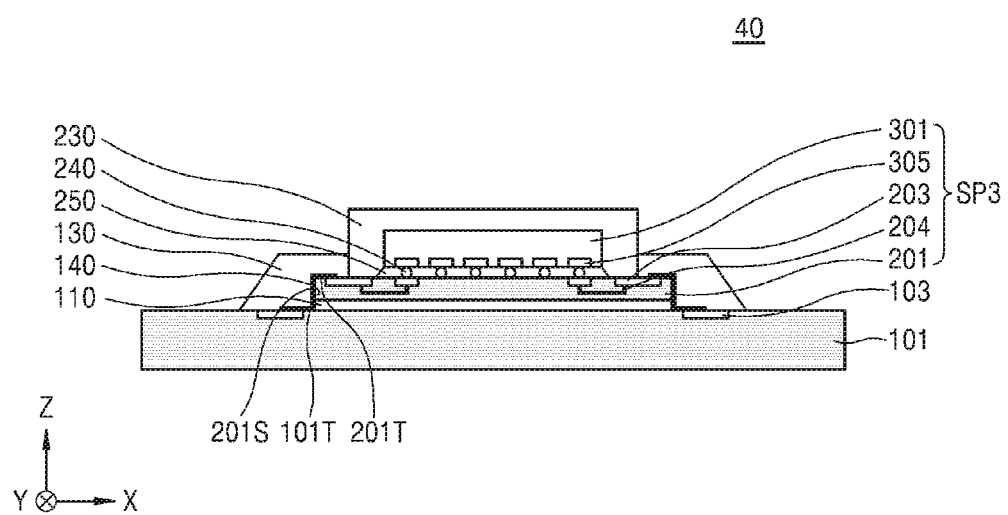

Referring to FIG. 5, a semiconductor module 40 may include the module substrate 101, a semiconductor package SP3 mounted on the module substrate 101, a first connection member 140 connecting the module substrate 101 to the semiconductor package SP3, and the first molding member 130 covering the first connection member 140.

The first connection member 140 may have a conductive structure which extends to cover the top surface 201T and the side surface 201S of the package substrate 201, and a top surface 101T of the module substrate 101. The first connection member 140 may include a conductive polymer or a conductive ink and may be formed by a dispensing process or the like. Insulating layers may be further formed between the first connection member 140 and the package substrate 201, and between the first connection member 140 and the module substrate 101.

The package substrate 201 may be electrically connected to the semiconductor chip 301 via the second connection member 240 connected to the connection pad 203. The second connection member 240 may include a solder ball or a solder bump. In other words, in the semiconductor module 40, the semiconductor chip 301 may be mounted on the package substrate 201 in a flip chip manner.

In addition, the first connection member 140 may be connected to one connection pad 203 of the package substrate 201, and the second connection member 240 may be connected to another connection pad 203, and thus, the connection pads 203 may be connected to one another via the internal wiring 204 of the package substrate 201. In other words, the first and second bonding wires 120 and 220 may be omitted from the semiconductor module 40.

A portion of the one connection pad 203 to which the first connection member 140 is connected may be covered by the first molding member 130, and the other portion of the one connection pad 203 to which the first connection member 140 is not connected may be covered by the second molding member 230.

In addition, a gap may be formed between the semiconductor chip 301 and the second connection member 240 in a process of connecting the semiconductor chip 301 to the second connection member 240. The gap may cause a reduction in reliability of a connection of the semiconductor chip 301 to the second connection member 240, and thus an underfill 250 may be injected and hardened to reinforce the connection.

The semiconductor chip 301 may be more stably fixed onto the second connection member 240 by the underfill 250, and the semiconductor chip 301 and the second connection member 240 may not be separated from each other, despite a difference in thermal expansion coefficients between the semiconductor chip 301 and the second connection member 240. In exemplary embodiments of the inventive concept, the second molding member 230 may be directly filled into the gap between the semiconductor chip 301 and the second connection member 240, and in this case, the underfill 250 may be omitted.

Figure 6:
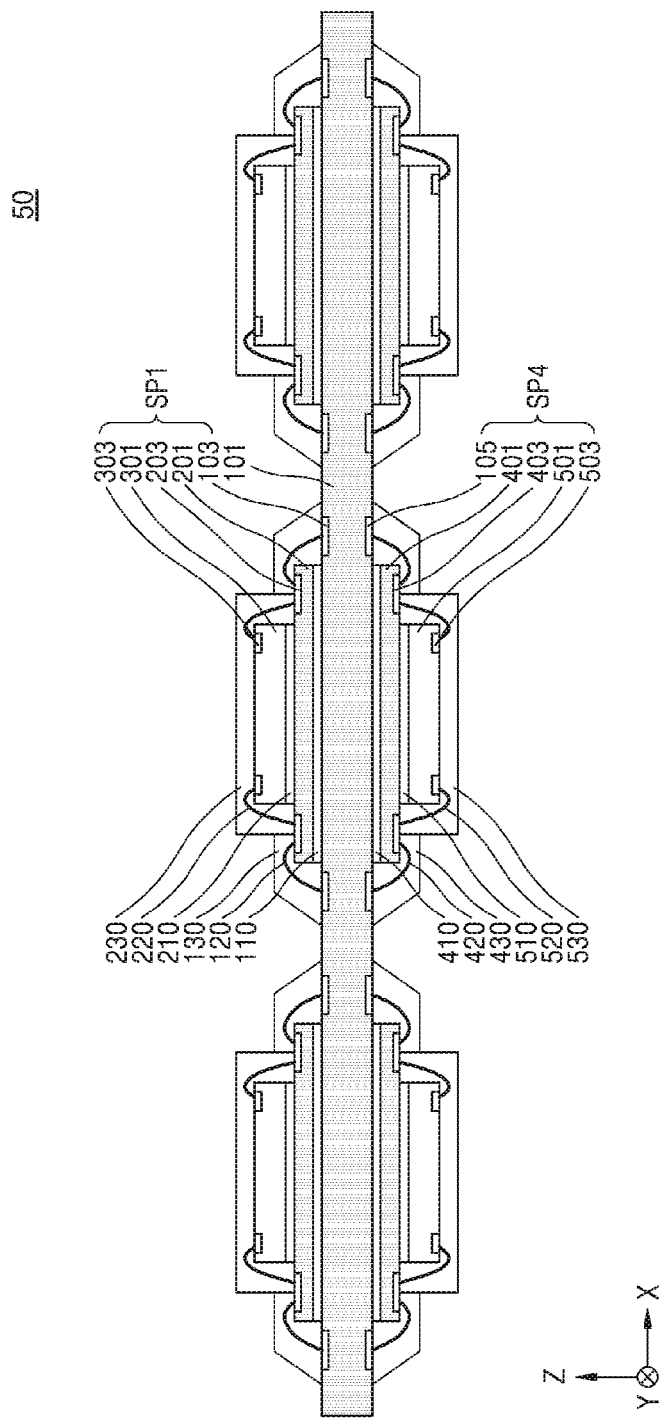

Referring to FIG. 6, a semiconductor module 50 may include the module substrate 101 having opposing top and bottom surfaces, a plurality of semiconductor packages SP1 mounted on the top surface of the module substrate 101, and a plurality of semiconductor packages SP4 mounted on the bottom surface of the module substrate 101.

A wiring may be formed on the module substrate 101, and the wiring may be connected to a bottom electrode pad 105 in the bottom surface of the module substrate 101. Accordingly, the wiring may be electrically connected to the semiconductor package SP4 via a third bonding wire 420 connected to the bottom electrode pad 105.

The plurality of semiconductor packages SP1 and the plurality of semiconductor packages SP4 may be mounted having a mirror image structure with the module substrate 101 therebetween. In other words, by mounting the plurality of semiconductor packages (SP1 and SP4) on the top and bottom surfaces of the module substrate 101, respectively, the semiconductor module 50 may have higher memory capacity, compared with a case in which the plurality of semiconductor packages (SP1 or SP4) are mounted on only one of the top surface and the bottom surface of the module substrate 101.

Figure 7:
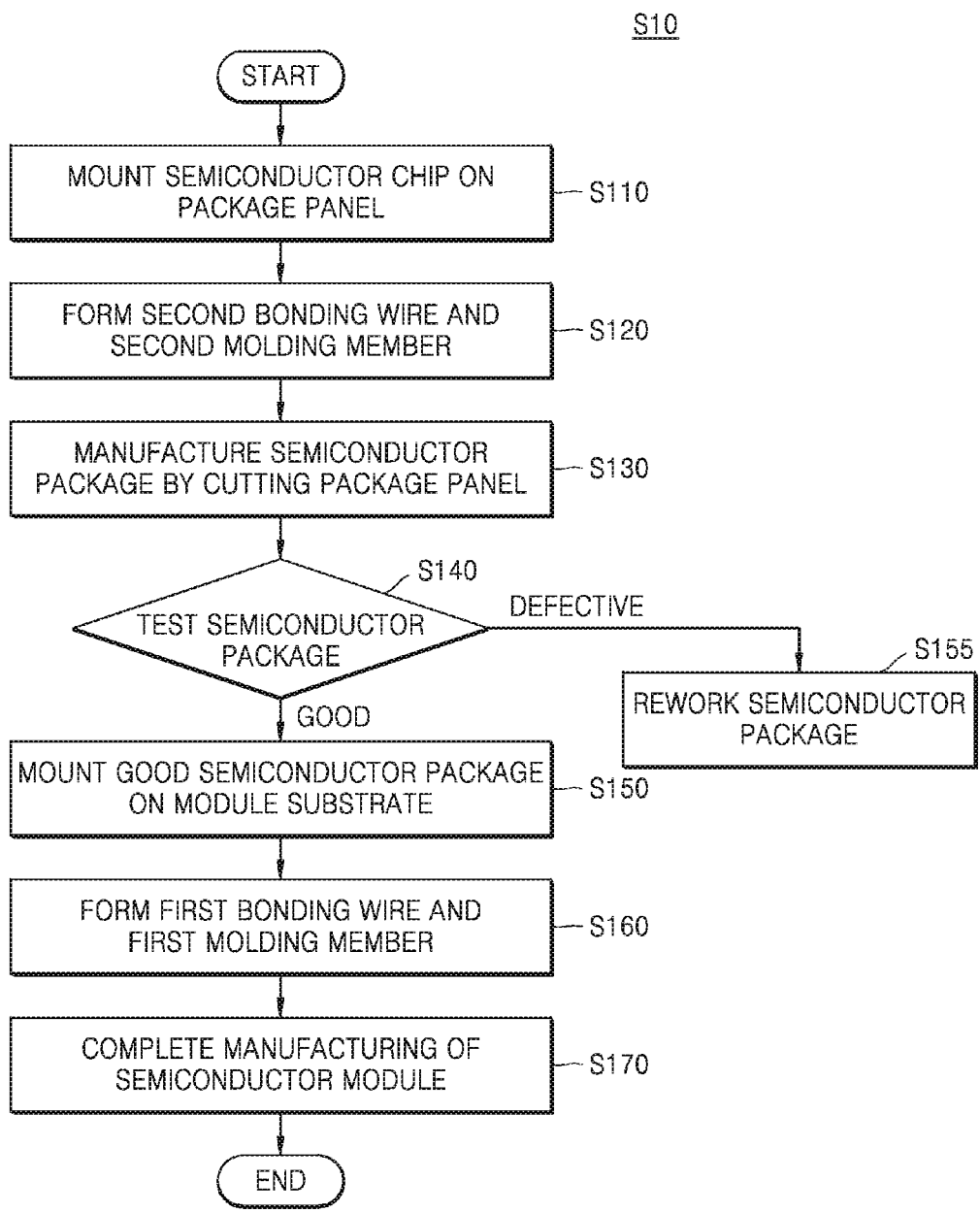
FIG. 7 is a flowchart of a manufacturing method of a semiconductor module, according to an exemplary embodiment of the inventive concept.

FIG. 7 is a flowchart of a manufacturing method of a semiconductor module, according to an exemplary embodiment of the inventive concept.

Referring to FIG. 7, a manufacturing method (S10) of the semiconductor module may include first operation S110 of mounting a semiconductor chip on a package panel, second operation S120 of forming a second bonding wire connecting the package panel to a semiconductor chip and a second molding member covering the second bonding wire, third operation S130 of manufacturing a semiconductor package by cutting the package panel, fourth operation S140 of performing a test on the semiconductor package, fifth operation S150 of mounting the semiconductor package of good quality on a module substrate, sixth operation S160 of forming a first bonding wire connecting the module substrate to the semiconductor package and a first molding member covering the first bonding wire, and seventh operation S170 of completing manufacture the semiconductor module.

On the other hand, if the semiconductor package is determined as defective in the fourth operation S140, the semiconductor package may be reworked in operation S155.

The manufacturing method (S10) of the semiconductor module may include the process operations described above (S110 through S170). According to exemplary embodiments of the inventive concept, the process operations may be performed in a different order depending on an implementation of the manufacturing method. For example, two consecutively described processes may be performed at substantially the same time or in an order opposite to the described order.

Technical characteristics of each of first through seventh operations S110 through S170 are described in detail with reference to FIGS. 8A through 8F below.

FIGS. 8A through 8F are cross-sectional views illustrating the manufacturing method of the semiconductor module of FIG. 7 according to a process sequence, according to an exemplary embodiment of the inventive concept.

Figure 8A:
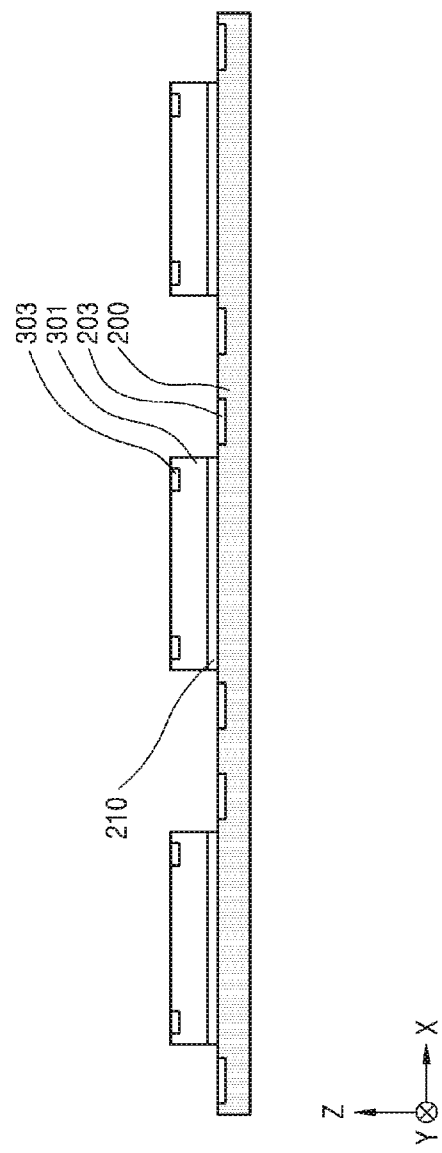
FIGS. 8A through 8F are cross-sectional views illustrating the manufacturing method of the semiconductor module of FIG. 7 according to a process sequence, according to an exemplary embodiment of the inventive concept.

Referring to FIG. 8A, a plurality of semiconductor chips 301 may be mounted on a top surface of a package panel 200 such that the semiconductor chip 301 is between connection pads 203 formed in the top surface of the package panel 200.

Each of the plurality of semiconductor chips 301 may include a volatile memory semiconductor and/or a nonvolatile memory semiconductor. Each of the plurality of semiconductor chips 301 may include a memory semiconductor having substantially the same specification. Each of the plurality of semiconductor chips may include at least one chip pad 303.

The second adhesive member 210 may be adhered to the top surface of the package panel 200 and the bottom surface of the semiconductor chip 301. The second adhesive member 210 may include a die attach film. The second adhesive member 210 may be adhered to an inactive surface of the plurality of semiconductor chips 301.

Figure 8B:
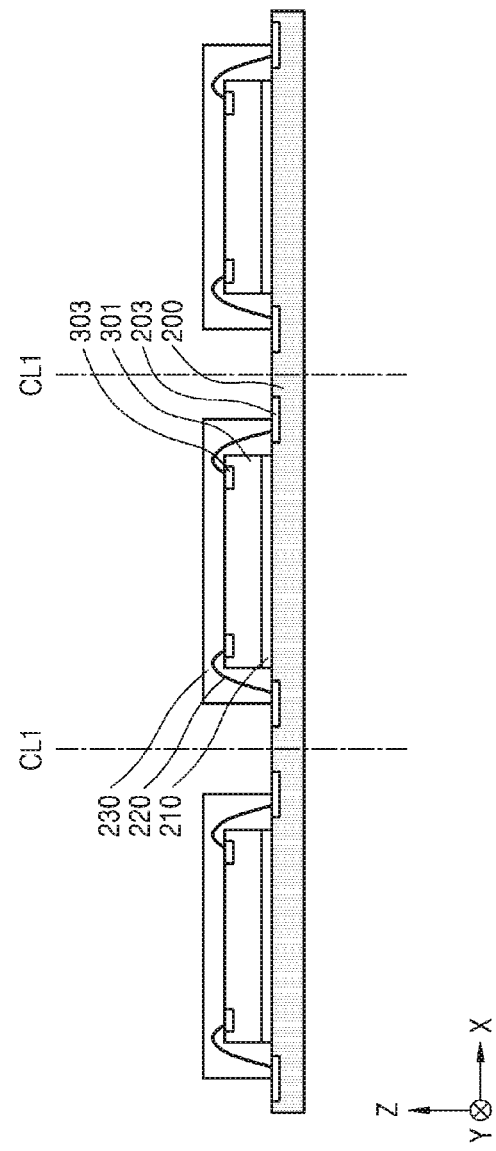

Referring to FIG. 8B, the second bonding wire 220 may be formed to electrically connect the package substrate 201 to the semiconductor chip 301, and the second molding member 230 may be formed to cover the second bonding wire 220.

The second bonding wire 220 may electrically connect the connection pad 203 of the package panel 200 to the chip pad 303 of the semiconductor chip 301, and thus, may electrically connect the package panel 200 to the semiconductor chip 301.

The second molding member 230 may protect the semiconductor chip 301 and the second bonding wire 220 from external influences. To perform the protection operation, a thickness of the second molding member 230 may be formed large enough to cover at least both the semiconductor chip 301 and the second bonding wire 120.

In this process, the second molding member 230 may be formed such that a portion of the connection pad 203 is exposed. In other words, the second molding member 230 may be formed such that a portion of one connection pad 203 to which the second bonding wire 220 is connected is covered by the second molding member 230, and the other portion of the one connection pad 203 to which the second bonding wire 220 is not connected is exposed.

Figure 8C:
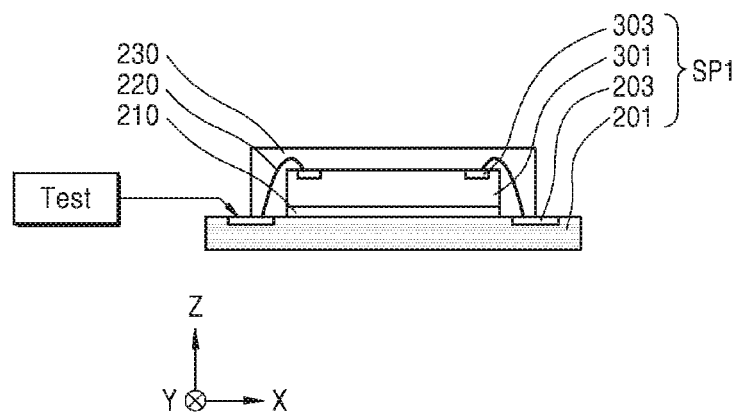

Referring to FIG. 8C, each of the semiconductor packages SP1 may be physically separated by cutting the package panel 200 along a first cutting line (CL1 in FIG. 8B) of the package panel (200 in FIG. 8B).

A test on the semiconductor package SP1 may be performed by connecting a test device Test to the connection pad 203 of the semiconductor package SP1. A portion of the one connection pad 203 to which the second bonding wire 220 is not connected may be exposed by not being covered by the second molding member 230, and thus the test may be performed by connecting the test device Test to the one connection pad 203.

In other words, in a general semiconductor module, a test on a semiconductor package may be performed before mounting the semiconductor package on a module substrate. To perform the test, the general semiconductor package may need to be individually provided with a test pad. In this case, the overall area of the semiconductor module may be increased due to an area occupied by the test pad.

On the other hand, according to exemplary embodiments of the inventive concept, since the test is performed by using the portion of the one connection pad 203 which is exposed by not being covered by the second molding member 230, the area of the package substrate 201 may be relatively reduced.

When the semiconductor package SP1 is determined as good in the test described above (refer to S140 in FIG. 7), the manufacturing method may proceed to a subsequent unit process (refer to S150 in FIG. 7), and when the semiconductor package SP1 is determined as defective, the manufacturing method may proceed to a rework process (refer to S155 in FIG. 7).

Figure 8D:
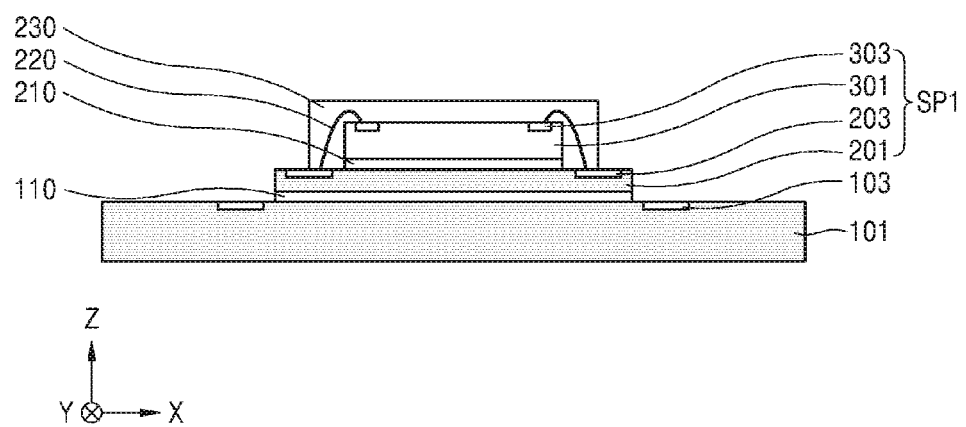

Referring to FIG. 8D, the semiconductor package SP1 may be mounted on the top surface of the module substrate 101 such that the semiconductor package SP1 is between the top electrode pads 103 formed in the top surface of the module substrate 101.

The semiconductor package SP1 determined as good in the above test may be mounted on the top surface of the module substrate 101 by using the first adhesive member 110. According to a type of the semiconductor chip 301 to be mounted on the semiconductor package SP1, the semiconductor package SP1 may be differentiated as either a logic package or a memory package.

The first adhesive member 110 may be adhered to the top surface of the module substrate 101 and the bottom surface of the semiconductor package SP1. The first adhesive member 110 may include a die attach film.

Figure 8E:
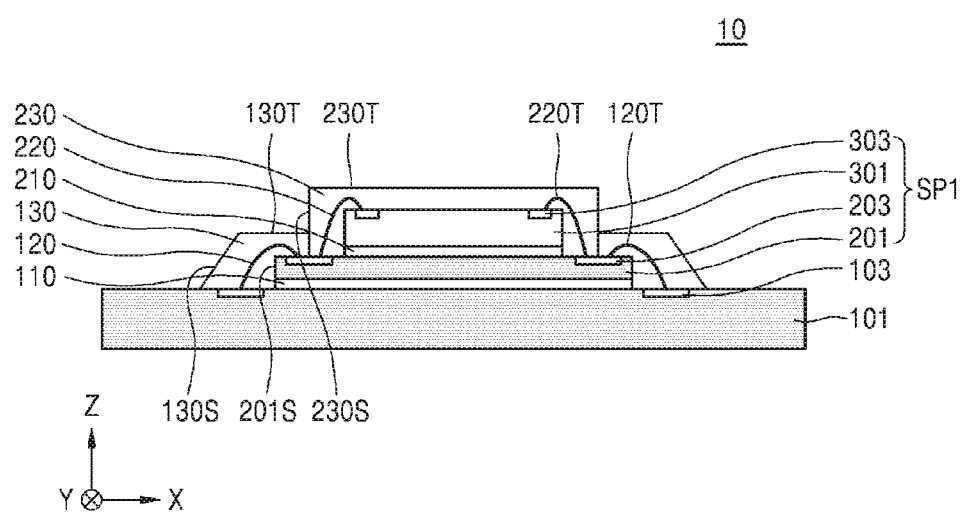

Referring to FIG. 8E, the first bonding wire 120 may be formed to electrically connect the module substrate 101 to the semiconductor package SP1, and the first molding member 130 may be formed to cover the first bonding wire 120.

The first bonding wire 120 may electrically connect the module substrate 101 to the semiconductor package SP1. In addition, the second bonding wire 220 may electrically connect the package substrate 201 to the semiconductor chip 301. As a result, the module substrate 101 may be electrically connected to the semiconductor chip 301. In addition, the level of the uppermost top end 120T of the first bonding wire 120 may be lower than the level of the uppermost top end 220T of the second bonding wire 220.

The first molding member 130 may protect the first bonding wire 120 from external influences. To perform the protection operation, the thickness of the first molding member 130 may be formed large enough to cover at least the entire portion of the first bonding wire 120.

In exemplary embodiments of the inventive concept, the first molding member 130 may be formed to cover the entire portion of the first bonding wire 120, and contact a portion of the side surface 230S of the second molding member 230. In other words, the level of the top surface 130T of the first molding member 130 may be formed to be lower than the level of the top surface 230T of the second molding member 230. In addition, at least one of the side surfaces 130S of the first molding member 130 may be an inclined surface.

Both the first bonding wire 120 and the second bonding wire 220 may be formed to be connected to one connection pad 203 of the package substrate 201. In addition, the connection pad 203 may be formed in a manner that a portion of the one connection pad 203 to which the first bonding wire 120 is connected is covered by the first molding member 130, and the other portion of the one connection pad 203 to which the second bonding wire 220 is connected is covered by the second molding member 230.

Through the manufacturing process described above, the semiconductor module 10 according to an exemplary embodiment of the inventive concept may be completed.

Figure 8F:
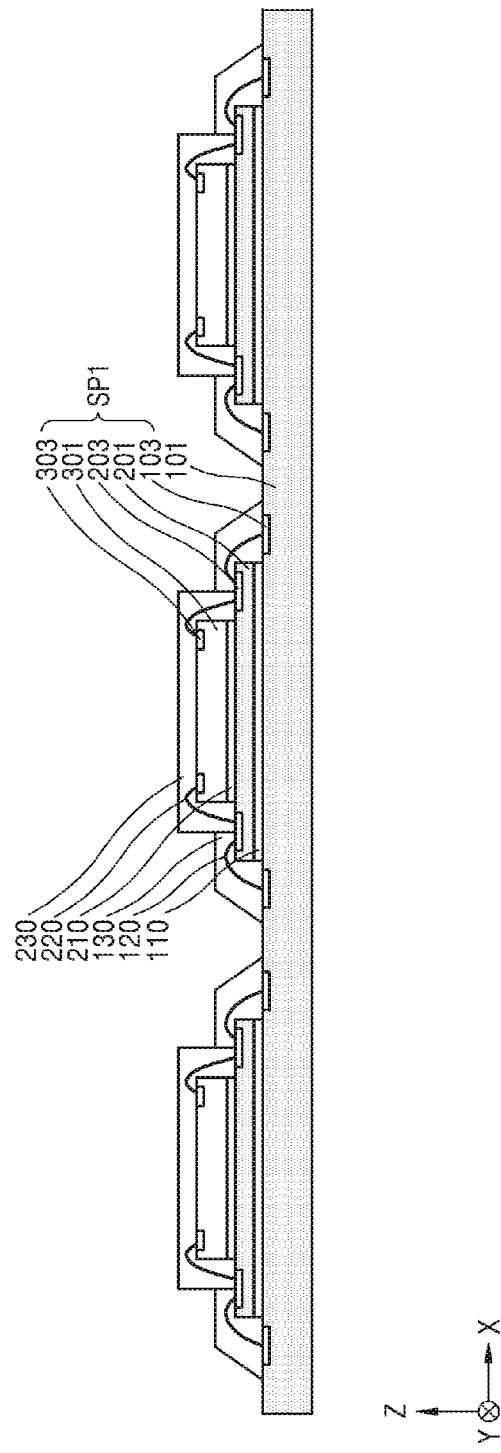

Referring to FIG. 8F, the plurality of semiconductor packages SP1 may be mounted on the top surface of the module substrate 101. The plurality of semiconductor packages SP1 may be mounted on the top surface of the module substrate 101 by simultaneously or sequentially performing the manufacturing processes described above.

Referring to FIG. 6 again, the plurality of semiconductor packages SP4 may be mounted on the bottom surface of the module substrate 101 by simultaneously or sequentially performing the manufacturing processes described above. The plurality of semiconductor packages SP1 and the plurality of semiconductor packages SP4 may be mounted having a mirror image structure with the module substrate 101 therebetween.

Through the manufacturing processes described above, by mounting the plurality of semiconductor packages (SP1 and SP4) on the top and bottom surfaces of the module substrate 101, respectively, the semiconductor module 50 may have higher memory capacity, compared with the case in which the plurality of semiconductor packages (SP1 or SP4) are mounted on only one of the top surface and the bottom surface of the module substrate 101.

Figure 9:
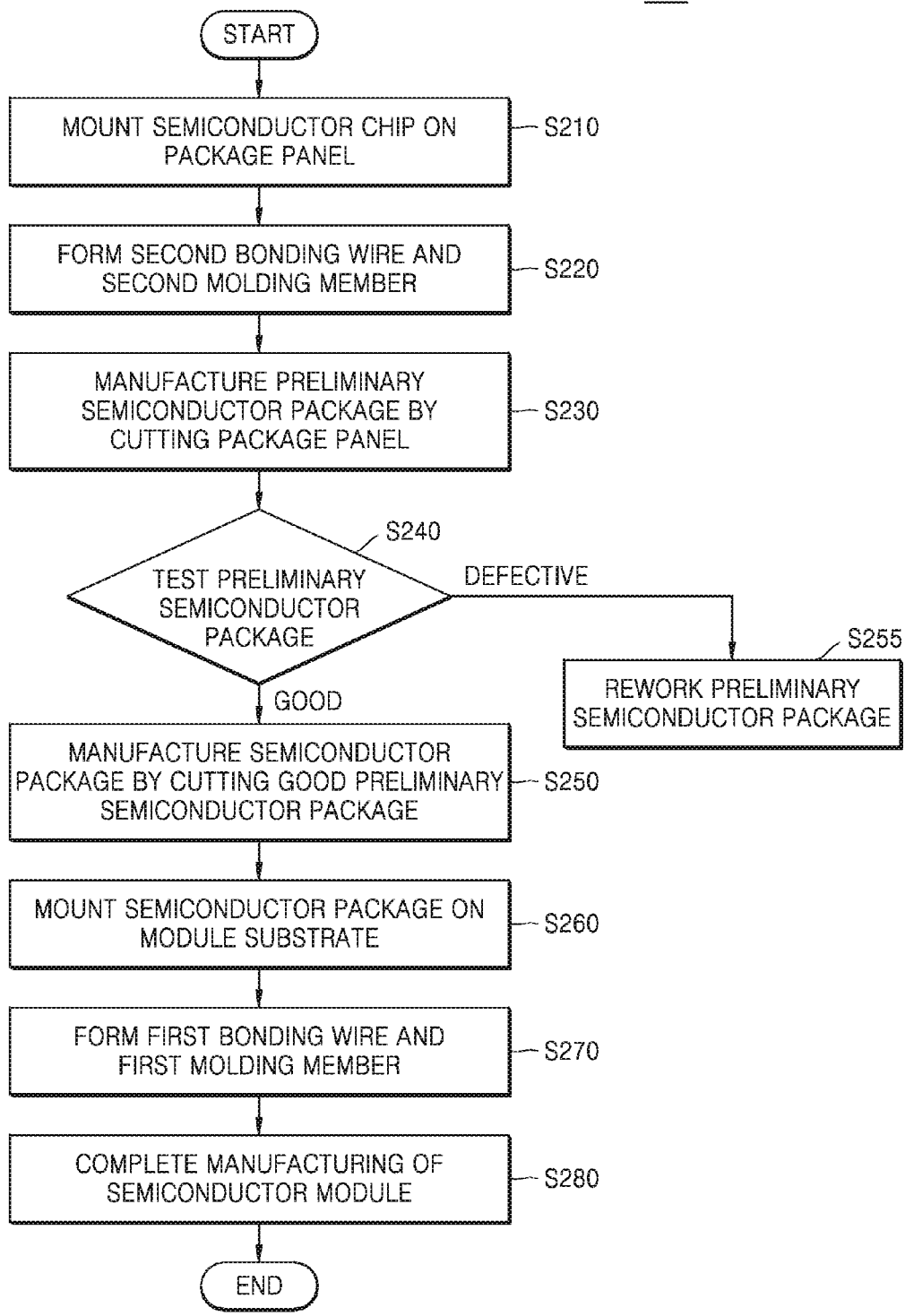
FIG. 9 is a flowchart of a manufacturing method of a semiconductor module, according to an exemplary embodiment of the inventive concept.

FIG. 9 is a flowchart of a manufacturing method of a semiconductor module, according to an exemplary embodiment of the inventive concept.

Referring to FIG. 9, a manufacturing method S20 of the semiconductor module may include first operation S210 of mounting a semiconductor chip on a package panel, second operation S220 of forming a second bonding wire connecting the package panel to the semiconductor chip and a second molding member covering the second bonding wire, third operation S230 of manufacturing a preliminary semiconductor package by cutting the package panel, fourth operation S240 of performing a test on the preliminary semiconductor package, fifth operation S250 of manufacturing a semiconductor package by processing (e.g., cutting) the preliminary semiconductor package of good quality, sixth operation S260 of mounting the semiconductor package of good quality on a module substrate, seventh operation S270 of forming a first bonding wire connecting the module substrate to the semiconductor package and a first molding member covering the first bonding wire, and eighth operation S280 of completing manufacture of the semiconductor module.

On the other hand, if the preliminary semiconductor package is determined as defective in the fourth operation S240, the semiconductor package may be reworked in operation S255.

The manufacturing method (S20) of the semiconductor module may include the process operations described above (S210 through S280). As described above, according to exemplary embodiments of the inventive concept, the process operations may be performed in a different order depending on an implementation of the manufacturing method.

Technical characteristics of each of first through eighth operations S210 through S280 are described in detail with reference to FIGS. 10A through 10C below.

Figure 10A:
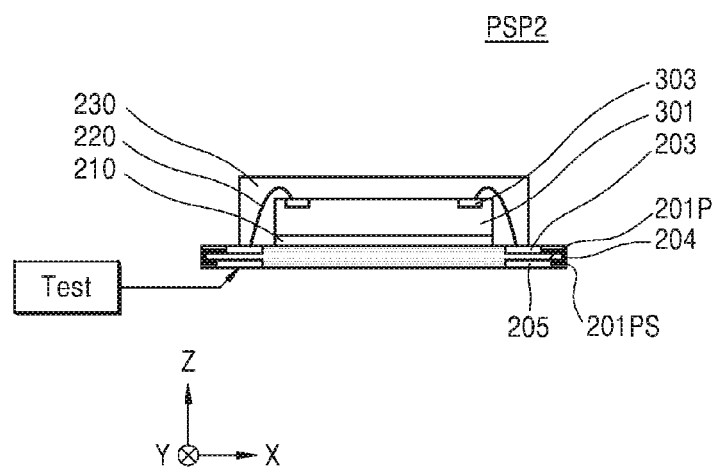
FIGS. 10A through 10C are cross-sectional views illustrating the manufacturing method of the semiconductor module of FIG. 9 according to a process sequence, according to exemplary embodiments of the inventive concept.
Figure 10B:
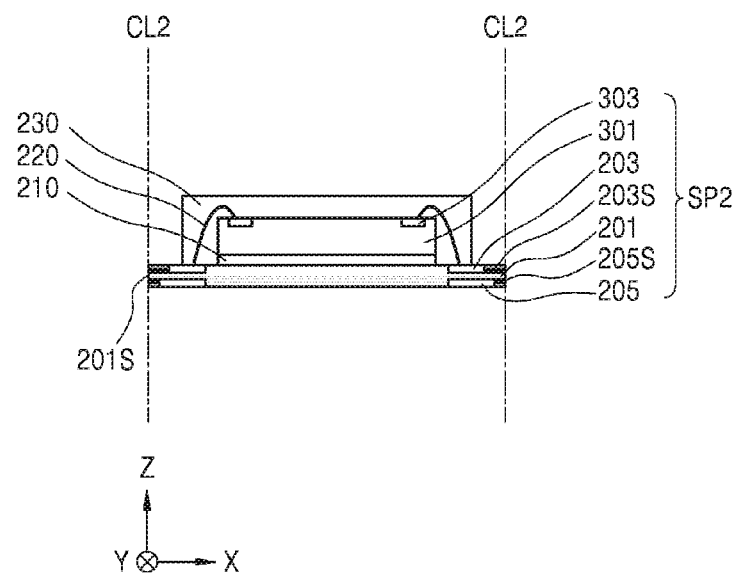
Figure 10C:
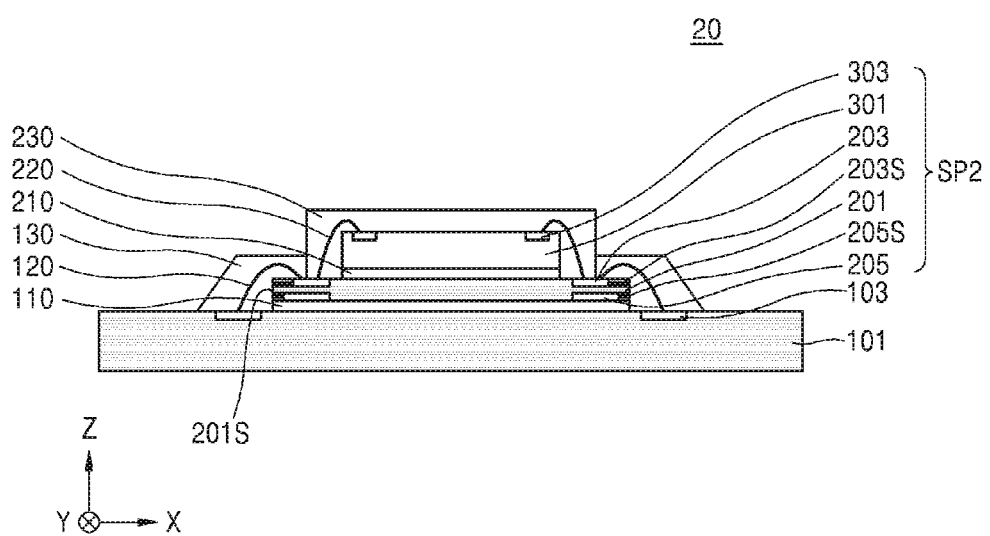

FIGS. 10A through 10C are cross-sectional views illustrating the manufacturing method of the semiconductor module of FIG. 9 according to a process sequence, according to exemplary embodiments of the inventive concept.

Most of operations constituting the manufacturing method (S20) of the semiconductor module described below are substantially the same as or similar to those described with reference to FIGS. 8A through 8F. Accordingly, for convenience of explanation, differences from the manufacturing method S10 of the semiconductor module described above are mainly described.

Referring to FIG. 10A, a test on a preliminary semiconductor package PSP2 may be performed by connecting the test device Test to the test pad 205 of the preliminary semiconductor package PSP2.

The connection pad 203 may be formed on a top surface of a preliminary package substrate 201P, and the test pad 205 may be formed on a bottom surface of the preliminary package substrate 201P. The connection pad 203 may be connected to the test pad 205 via the internal wiring 204.

A portion of the connection pad 203 to which the second bonding wire 220 is not connected may be formed to be exposed by the second molding member 230. However, when an exposed area is not sufficient for connecting the test device Test, the test may be performed by connecting the test device Test to the test pad 205.

A vertical portion of the internal wiring 204 extending from the connection pad 203 and the test pad 205 may be formed to be exposed by a side surface 201PS of the preliminary package substrate 201P.

When the preliminary semiconductor package PSP2 is determined as good in the test described above (refer to S240 in FIG. 9), the manufacturing method may proceed to a subsequent unit process (refer to S250 in FIG. 9), and when the preliminary semiconductor package PSP2 determined as defective, the manufacturing method may proceed to a rework process (refer to S255 in FIG. 9).

Referring to FIG. 10B, the semiconductor package SP2 in which the connection pad 203 and the test pad 205 are separated from each other may be formed by cutting edges of the preliminary semiconductor package (PSP2 in FIG. 10A) along a second cutting line CL2 of the package substrate 201.

By cutting edges of the preliminary semiconductor package PSP2 including the vertical portion of the internal wiring 204 which extends from the connection pad 203 and the test pad 205, the area of the package substrate 201 may be reduced, and at the same time, the connection pad 203 and the test pad 205 may be electrically completely separated from each other.

Referring to FIG. 10C, the first bonding wire 120 may be formed to electrically connect the module substrate 101 to the semiconductor package SP2, and the first molding member 130 may be formed to cover the first bonding wire 120.

The first bonding wire 120 may electrically connect the module substrate 101 to the semiconductor package SP2. In addition, the second bonding wire 220 may electrically connect the package substrate 201 to the semiconductor chip 301. As a result, the module substrate 101 may be electrically connected to the semiconductor chip 301.

The portion of the internal wiring 203S extending from the connection pad 203 and the portion of the internal wiring 205S extending from the test pad 205 may be formed to be exposed on the side surface 201S of the package substrate 201.

The first adhesive member 110 may be formed to be adhered to the top surface of the module substrate 101 and the bottom surface of the semiconductor package SP2. In addition, the second adhesive member 210 may be formed to be adhered to the top surface of the package substrate 201 and the bottom surface of the semiconductor chip 301. In this case, the connection pad 203 may be formed not to be covered by the second adhesive member 210, but the test pad 205 may be formed to be covered by the first adhesive member 110. In other words, the test pad 205 may be formed not to be electrically connected to the semiconductor chip 301 and the module substrate 101.

Through the manufacturing process described above, the semiconductor module 20 according to an exemplary embodiment of the inventive concept may be completed.

Figure 11:
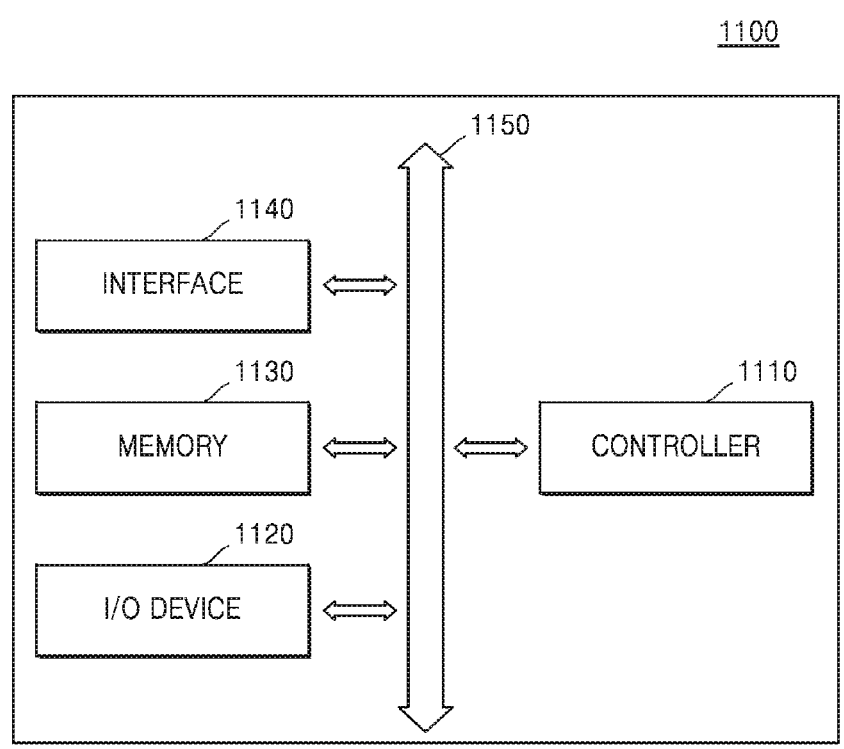
FIG. 11 is a configuration diagram of a system of a semiconductor module, according to an exemplary embodiment of the inventive concept.

FIG. 11 is a configuration diagram of a system of a semiconductor module, according to an exemplary embodiment of the inventive concept.

Referring to FIG. 11, a system 1100 may include a controller 1110, an input/output (I/O) device 1120, a memory 1130, an interface 1140, and a bus 1150.

The system 1100 may be a mobile system or a system that transmits or receives information. In exemplary embodiments of the inventive concept, the mobile system may be a portable computer, a web tablet, a mobile phone, a digital music player, or a memory card.

The controller 1110 may be for controlling execution programs in the system 1100, and may include a microprocessor, a digital signal processor, a micro-controller, or a similar device.

The I/O device 1120 may be used to input or output data of the system 1100. The system 1100 may be connected to an external device, for example, a personal computer or a network, by using the I/O device 1120, and may exchange data with the external device. The I/O device 1120 may be, for example, a touch pad, a keyboard, or a display.

The memory 1130 may store data for an operation of the controller 1110, or may store data processed by the controller 1110. The memory 1130 may include any one of the semiconductor modules (10 through 50) described with reference to FIGS. 2A through 6B according to exemplary embodiments of the inventive concept.

The interface 1140 may be a data transmission path between the system 1100 and the external device. The controller 1110, the I/O device 1120, the memory 1130, and the interface 1140 may communicate with one another via the bus 1150.

While the inventive concept has been particularly shown and described with reference to exemplary embodiments thereof, it will be understood by those of ordinary skill in the art that various changes in form and details may be made thereto without departing from the spirit and scope of the inventive concept as set forth by the following claims.

What is claimed is:

1. A semiconductor module comprising:
a module substrate comprising a top electrode pad;
a first adhesive member disposed on the module substrate;
a semiconductor package mounted on the module substrate via the first adhesive member;
a first connection member connecting the module substrate to the semiconductor package; and
a first molding member covering the first connection member,
wherein the semiconductor package comprises:
a package substrate comprising a connection pad and a test pad;
a semiconductor chip mounted on the package substrate in a flip chip manner;
a second connection member connecting the package substrate to the semiconductor chip; and
a second molding member covering the semiconductor chip, and
wherein the first connection member connects the top electrode pad to the test pad;
wherein the first adhesive member is adhered to a top surface of the module substrate and to a bottom surface of the semiconductor package; and
wherein a portion of a top surface of the test pad of the package substrate is covered by the first molding member, and a remaining portion of the top surface of the test pad is covered by the second molding member.

2. The semiconductor module of claim 1, wherein the first connection member comprises a first bonding wire.

3. The semiconductor module of claim 1, wherein the first connection member extends over a top surface and a side surface of the package substrate and over a top surface of the module substrate.

4. The semiconductor module of claim 1, wherein
the second connection member comprises a solder ball disposed between the semiconductor chip and the package substrate, and
an underfill covers the second connection member.

5. The semiconductor module of claim 1, wherein the connection pad and the test pad are electrically connected to each other by an internal wiring of the package substrate.

6. The semiconductor module of claim 5, wherein
the second connection member electrically connects the semiconductor chip to the connection pad, and
the module substrate is electrically connected to the semiconductor chip.

7. The semiconductor module of claim 1, wherein
the first molding member contacts a portion of a side surface of the second molding member, and
the second molding member covers an entirety of the semiconductor chip and an entirety of the second connection member.

8. The semiconductor module of claim 1, wherein
at least one side surface of the first molding member forms an angle greater than 90 degrees with a top surface of the first molding member, and
a side surface of the package substrate protrudes outwardly from a side surface of the second molding member.

9. The semiconductor module of claim 1, wherein
a portion of a top surface of the package substrate is covered by the second molding member, and
a remaining portion of the top surface of the package substrate is covered by the first molding member.

10. A semiconductor module comprising:
a module substrate;
a semiconductor package mounted on the module substrate;
a first connection member connecting the module substrate to the semiconductor package; and
a first molding member covering the first connection member,
wherein the semiconductor package comprises:
a package substrate;
a semiconductor chip mounted on the package substrate in a flip chip manner;
a second connection member connecting the package substrate to the semiconductor chip; and
a second molding member covering the semiconductor chip, wherein the semiconductor package is mounted on the module substrate using a first adhesive member that contacts a bottom surface of the semiconductor package and a top surface of the module substrate, and
wherein a portion of a top surface of one connection pad of the package substrate is covered by the first molding member, and a remaining portion of the top surface of the one connection pad is covered by the second molding member.

11. The semiconductor module of claim 10, wherein the first connection member extends over a top surface and a side surface of the package substrate and over a top surface of the module substrate.

12. The semiconductor module of claim 10, wherein
the second connection member comprises a solder ball disposed between the semiconductor chip and the package substrate, and
an underfill covers the second connection member.

13. The semiconductor module of claim 10, wherein the one connection pad and the second connection member are electrically connected to each other by an internal wiring of the package substrate.

14. The semiconductor module of claim 10, wherein
the module substrate comprises top and bottom surfaces,
the top and bottom surfaces of the module substrate are opposite each other,
at least one semiconductor package is mounted on the top surface of the module substrate, and
at least one semiconductor package is mounted on the bottom surface of the module substrate.

* * * * *